United States Patent
Ryu et al.

(10) Patent No.: US 9,099,196 B2
(45) Date of Patent: Aug. 4, 2015

(54) SEMICONDUCTOR MEMORY DEVICE AND METHOD OF OPERATING THE SAME

(71) Applicant: Samsung Electronics Co., Ltd., Suwon-si (KR)

(72) Inventors: Jang-Woo Ryu, Seoul (KR); Young-Dae Lee, Yongin-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/141,233

(22) Filed: Dec. 26, 2013

(65) Prior Publication Data

US 2014/0211577 A1    Jul. 31, 2014

Related U.S. Application Data

(60) Provisional application No. 61/756,565, filed on Jan. 25, 2013.

(30) Foreign Application Priority Data

Apr. 22, 2013   (KR) .................. 10-2013-0044332

(51) Int. Cl.
  *G11C 11/00*   (2006.01)
  *G11C 11/406*   (2006.01)
  *G11C 11/4074*   (2006.01)
(52) U.S. Cl.
  CPC ...... *G11C 11/40626* (2013.01); *G11C 11/4074* (2013.01)

(58) Field of Classification Search
  CPC .............................. G11C 13/0069; G11C 5/14
  USPC ............................................. 365/189.16, 226
  See application file for complete search history.

(56) References Cited

U.S. PATENT DOCUMENTS

| | | | |
|---|---|---|---|
| 6,894,930 B2 | 5/2005 | Chien et al. | |
| 7,663,919 B2 | 2/2010 | Shibata et al. | |
| 2012/0300550 A1* | 11/2012 | Hemink et al. | 365/185.17 |

FOREIGN PATENT DOCUMENTS

| | | |
|---|---|---|
| KR | 10-0819645 B1 | 3/2008 |
| KR | 10-2008-0030838 A | 4/2008 |
| KR | 10-0826981 B1 | 4/2008 |
| KR | 10-2009-0077586 A | 7/2009 |
| KR | 10-2010-0023762 A | 3/2010 |
| KR | 10-2011-0003676 A | 1/2011 |
| KR | 10-2011-0059124 A | 6/2011 |
| KR | 10-2012-0025768 A | 3/2012 |

* cited by examiner

*Primary Examiner* — Michael Tran
(74) *Attorney, Agent, or Firm* — Muir Patent Law, PLLC

(57) ABSTRACT

A method of operating a semiconductor memory device is disclosed. The method may include receiving an access command, applying a first voltage to a selected word line of the semiconductor memory device for a period of time in response to receiving the access command, applying a second voltage to word lines adjacent to the selected word line before and after the period of time, and applying a third voltage to the word lines adjacent to the selected word line for the period of time, a voltage level of the third voltage greater than the second voltage. The applying the third voltage may occur when the semiconductor memory device is operated at a temperature below the predetermined temperature.

20 Claims, 13 Drawing Sheets

SEMICONDUCTOR MEMORY DEVICE AND METHOD OF OPERATING THE SAME

CROSS-REFERENCE TO RELATED APPLICATIONS

This U.S. non-provisional patent application claims priority under 35 U.S.C. §119 to U.S. provisional application No. 61/756,565 filed on Jan. 25, 2013 and to Korean Patent Application No. 10-2013-0044332, filed on Apr. 22, 2013, the entire contents of which are hereby incorporated by reference.

BACKGROUND

The present disclosure herein relates to a semiconductor memory device, and more particularly, to a semiconductor memory device with write operation characteristics and a method of operating the semiconductor memory device.

Generally, volatile memory devices such as Dynamic Random Access Memories (Hereinafter, referred to as DRAM) are accessed by a controller to perform a read operation or a write operation.

Since the distance between word lines, which selects the row direction of memory cells gets narrower due to the shrinkage of the DRAM manufacturing process, a further process shrinkage is physically facing a scaling limitation.

As a word line accessed gets closer to a word line adjacent thereto, the field coupling influence may increase. Accordingly, the fluctuation of a threshold voltage of an access transistor constituting a memory cell may get severe. When the threshold voltage of the access transistor becomes higher than a predetermined threshold voltage, the write operation characteristics of the DRAM, for example, tRDL (Last data-in to PRE command Period) parameter characteristics may become poor. Meanwhile, when the threshold voltage of the access transistor becomes lower than the predetermined threshold voltage due to the occurrence of a passing gate effect, the refresh operation characteristics of the DRAM may become worse.

SUMMARY

The present disclosure provides a semiconductor memory device and a method of operating the semiconductor memory device, which can improve the write operation characteristics using a passing gate effect.

In one embodiment, a method of operating a semiconductor memory device is disclosed. The method may include receiving an access command, applying a first voltage to a selected word line of the semiconductor memory device for a period of time in response to receiving the access command, applying a second voltage to word lines adjacent to the selected word line before and after the period of time, and applying a third voltage to the word lines adjacent to the selected word line for the period of time, a voltage level of the third voltage greater than the second voltage. The applying the third voltage may occur when the semiconductor memory device is operated at a temperature below the predetermined temperature.

In another embodiment, a semiconductor memory device includes a memory cell array, a voltage generator and a control circuit. The memory cell array may include a plurality of memory cells connected to word lines. The voltage generator may be configured to generate a first voltage and a second voltage having a level higher than the first voltage. A level of the first voltage may be a negative voltage lower than a ground voltage. The control circuit may be configured to control applying the first voltage to word lines adjacent to a selected word line of the memory cell array before and after a period of time, and applying the second voltage to the word lines adjacent to the selected word line for the period of time. The applying the second voltage may occur in response to receiving an access command.

In still another embodiment, a method of operating a semiconductor memory device including a memory cell array is disclosed. The method may include applying a first voltage to a selected word line of the memory cell array for a period of time in response to receiving an access command, applying a second voltage to one or more word lines adjacent to the selected word line, a level of the second voltage less than the first voltage, and for the period of time, switching the second voltage to a third voltage and applying the third voltage to the one or more word lines adjacent to the selected word line, a level of the third voltage greater than the second voltage and less than the first voltage. The switching the second voltage to the third voltage may occur when the semiconductor memory device is operated at a temperature below the predetermined temperature.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain principles of the disclosure. In the drawings.

DETAILED DESCRIPTION OF THE EMBODIMENTS

Figure 1:
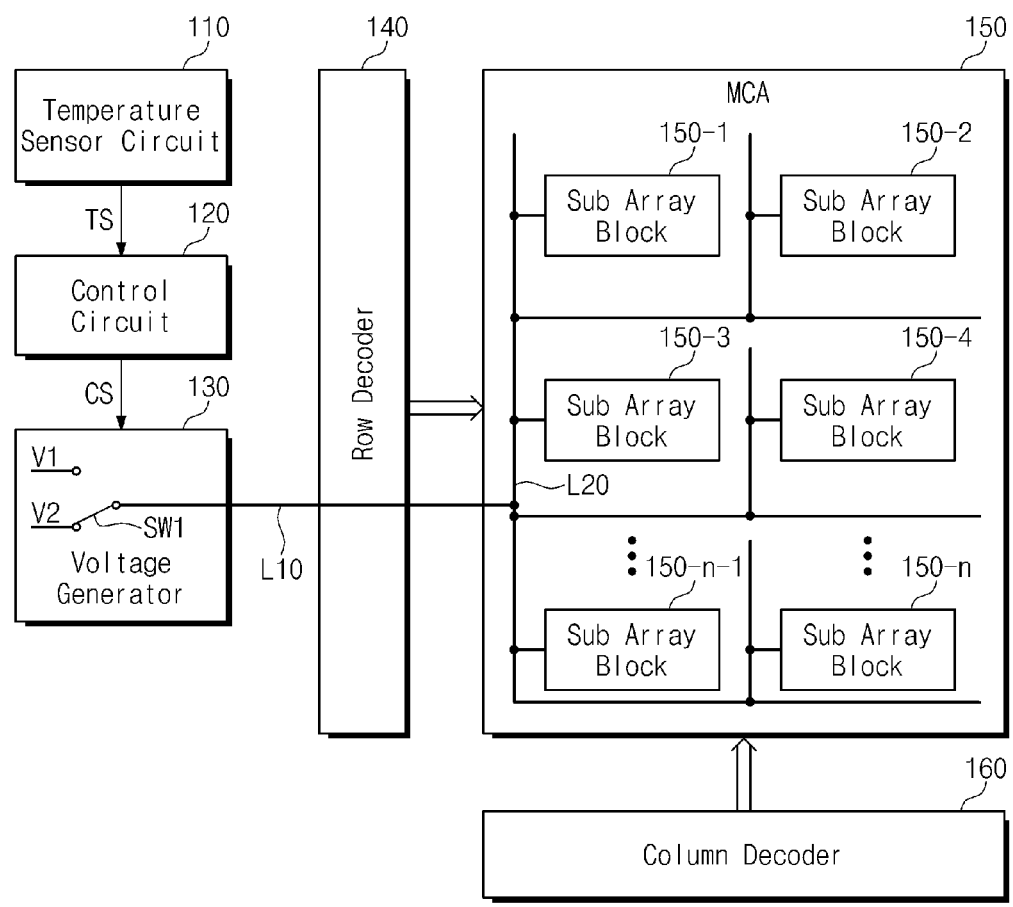
FIG. 1 is an exemplary block diagram illustrating a semiconductor memory device according to one embodiment.

Exemplary embodiments of the disclosure will be described below in more detail with reference to the accompanying drawings. The disclosure may, however, be embodied in different forms and should not be construed as limited to the embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

Also, the same or similar reference numerals proposed in each drawing indicate the same or similar components. In some drawings, the connection relations of elements and lines are shown just for effective description of the technical contents, and thus other elements or circuit blocks can be further provided.

It will be understood that, although the terms first, second, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present disclosure.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

It should be noted that embodiments set forth herein may include their complementary embodiments and details about basic data access operation (including read and write operations) on DRAM, precharge operation, refresh operation, and internal functional circuits will not be described in detail so as not to obscure the important points of the inventive concept.

Hereinafter, exemplary embodiments of the disclosure will be described in detail with reference to the accompanying drawings.

FIG. 1 is an exemplary block diagram illustrating a semiconductor memory device according to one embodiment.

Referring to FIG. 1, a semiconductor memory device may include a temperature sensor circuit 110, a control circuit 120, a voltage generator 130, a row decoder 140, a memory cell array 150 and a column decoder 160. The memory cell array 150 may include a plurality of sub array blocks 150-1, 150-2, . . . , 150-$n$-1, 150-$n$. When the memory cell is configured with a Dynamic Random Access Memory (DRAM) memory cell, the semiconductor memory device may be a Dynamic Random Access Memory (DRAM).

The row decoder 140 may select the row of the memory cell array 150 by decoding a row address. A word line of memory cells selected by the row decoder may be activated.

The column decoder 160 may select the column of the memory cell array 150 by decoding a column address. Sensed data may be read from the memory cells selected by the column decoder, or write data may be written to the selected memory cells.

For example, the DRAM may operate in an access operation mode by a controller. The access operation mode of the DRAM may include a write operation mode and a read operation mode.

Before the access operation mode is performed or after the access operation mode is finished, word lines may be precharged at a precharge voltage level.

Generally, the precharge voltage level of the DRAM may be a VBB2 voltage level. The VBB2 voltage level may be higher than VBB that is a back bias voltage, and may be lower than VSS that is a ground voltage. For example, in case of high integrated DRAM, the VBB2 voltage level may be near −0.35 V.

In FIG. 1, a first voltage V1 generated from the voltage generator 130 may be at the VBB2 voltage level, and a second voltage V2 generated from the voltage generator 130 may be at a voltage level higher than the VBB2 voltage.

When the first voltage V1 is applied to the word lines of the memory cell array 150 through supply lines L10 and L20, the word lines may be precharged at the VBB2 voltage level. When an access command is applied from a memory controller, a selected word line may be activated at a high voltage level, e.g., VPP voltage level.

In case of a high integrated DRAM manufactured by a several tens of nanometer process, a distance between a word line accessed and a word line adjacent thereto may be very short. Accordingly, a passing gate effect may occur due to the field coupling influence.

When the passing gate effect occurs, the threshold voltage of the memory cell of the selected word line may be lowered by the electric field of word lines adjacent to the selected word line. For example, when the threshold voltage of the access transistor constituting the memory cell is lowered, the write operation characteristics of the DRAM may be improved. In contrast, when the threshold voltage of the memory cell is lowered, a leakage current may increase and then the refresh operation characteristics of the DRAM may be deteriorated.

Accordingly, when the threshold voltage of the access transistor becomes lower, the write operation characteristics of the DRAM, for example, tRDL (Last data-in to PRE command Period) parameter characteristics may be improved, but the refresh operation characteristics of the DRAM may be deteriorated.

On the contrary, when the threshold voltage of the access transistor is higher, the tRDL parameter characteristics may be deteriorated, but the refresh operation characteristics of the DRAM may be improved.

Accordingly, when an access command is received, the control circuit 120 may allow the second voltage V2 to be applied to word lines adjacent to a word line to be accessed in the memory cell array such that the threshold voltage of the access transistor of the memory cell connected to the word line to be accessed is lowered due to the occurrence of the passing gate effect.

In certain embodiments, while the occurrence of the passing gate effect is inhibited at a high temperature region, the occurrence of the passing gate effect may be used at a low temperature region to improve the write operation characteristics, i.e., the tRDL parameter characteristics of the DRAM.

In FIG. 1, the temperature sensor circuit 110 may output a temperature sensing signal TS. The temperature sensor circuit 110 may sense ambient temperature of the memory cell array 150 to set the temperature range in which the passing gate effect is applied. The temperature sensor circuit 110 may be disposed around a plurality of sub array blocks in the memory cell array 150 or on a peripheral circuit.

Generally, since the characteristics of the semiconductor device are deteriorated at a high temperature region compared to a low temperature region, the refresh characteristics may be deteriorated. Accordingly, in the disclosure, the passing gate effect may be used in order to improve the write characteristics at a relatively low temperature region. (e.g., below 0° C.)

The control circuit 120 may activate the control signal CS when the temperature sensing signal TS is indicated a low temperature region in response to the access command. As the control signal CS is activated, a switch SW1 of the voltage generator 130 may be switched on to a supply terminal of the second voltage V2. Accordingly, the second voltage V2 is applied to the word lines of the memory cell array 150 as a precharge voltage through the supply lines L10 and L20.

When the access command is applied, a selected word line may be activated at a high voltage level, e.g., VPP voltage level. Compared to when the word lines adjacent to the selected word line are precharged at the first voltage V1, since the occurrence of the passing gate effect is further intensified, the threshold voltage of the access transistor connected to the selected word line may be further lowered.

Thus, the write operation characteristics may be improved.

Figure 2:
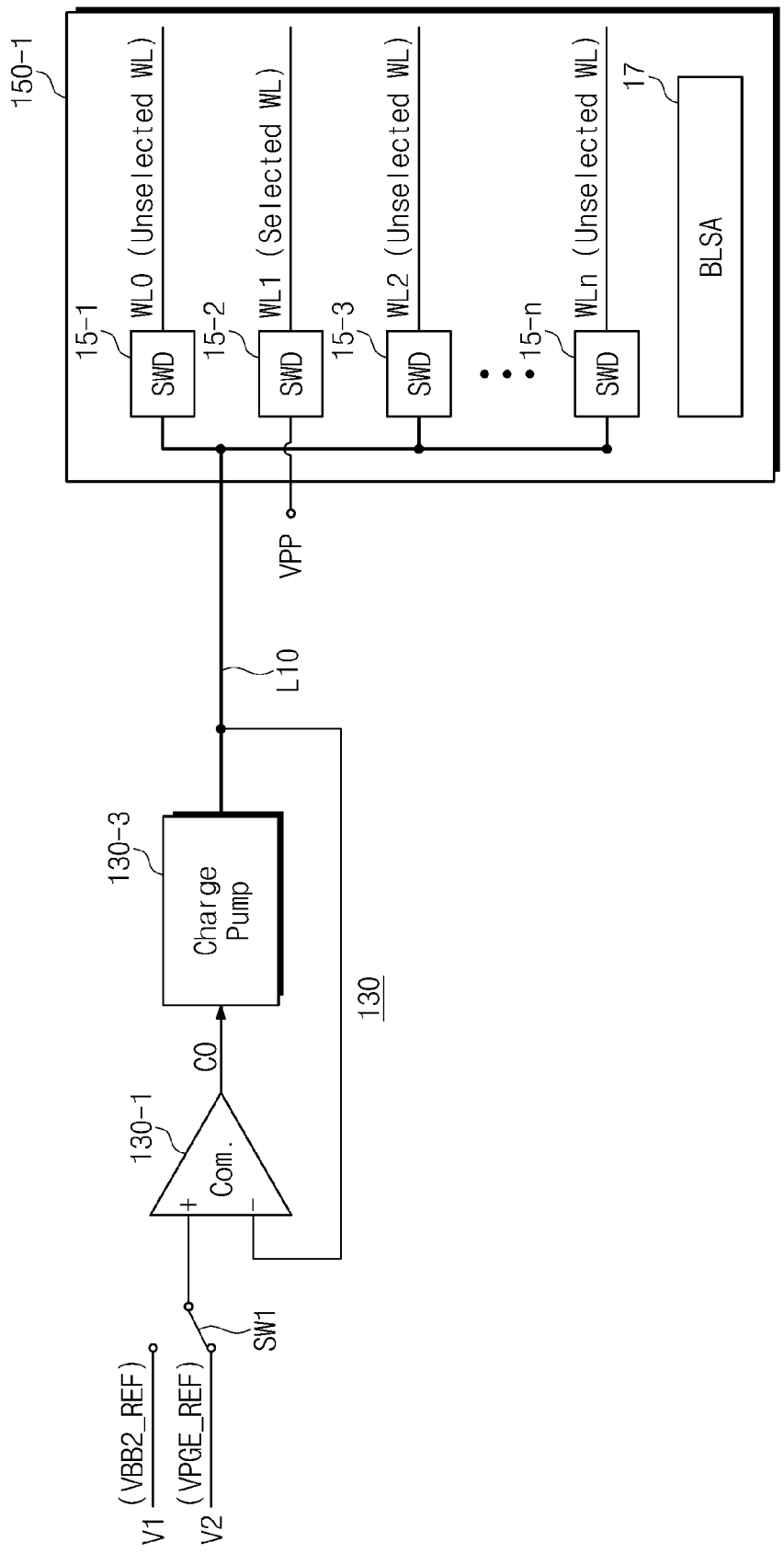
FIG. 2 is an exemplary diagram illustrating a voltage generator and a sub array block of FIG. 1 according to one embodiment.

FIG. 2 is an exemplary diagram illustrating a voltage generator and a sub array block of FIG. 1 according to one embodiment.

Referring to FIG. 2, the voltage generator 130 may include a comparator 130-1 and a charge pump 130-3. A first input terminal (+) of the comparator 130-1 may be operationally connected to the supply terminal of the first voltage V1 or the supply terminal of the second voltage V2 through the switch SW1. A second input terminal (−) of the comparator 130-1 may be connected to the supply line L10 to receive a feedback voltage. An output signal C0 of the comparator 130-1 may serve to control charge pumping of the charge pump 130-3. When the switch SW1 is switched on to the first voltage V1, the voltage on the supply line L10 may be equal to a first predetermined reference voltage VBB2_REF, and when the switch SW1 is switched on to the second voltage V2, the voltage on the supply line L10 may become equal to a second predetermined reference voltage VPGE REF.

In one embodiment, in FIG. 1, a sub array block 150-1 may include a plurality of sub word line drivers 15-1, 15-2, . . . , 15-n and a bit line sense amp 17.

Assuming that the word line WL 1 is selected by the sub word line driver 15-2, the sub word line driver 15-2 may drive the selected word line WL1 at a high voltage level, e.g., VPP voltage level. Meanwhile, word lines WL0 and WL2 adjacent to the selected word line WL1 may be driven at a VPGE voltage level by the sub word line drivers 15-1 and 15-3. Since the VPGE voltage level is the second voltage V2 that is higher than the first voltage V1, the threshold voltage of the access transistor connected to the word line WL1 may be lowered due to the occurrence of the passing gate effect. In some situations, data in memory cells connected to the word lines WL0 and WL2 may be lost after the VPGE voltage is applied. Accordingly, the memory cells may have additional refreshes to improve a refresh operation. For example, data in memory cells can be easily lost when an operating temperature of the semiconductor memory device is high. In one embodiment, the memory cells connected to the word lines WL0 and WL2 are controlled to refresh right after the VPGE voltage is applied when the operating temperature is higher than a specific temperature.

In FIG. 2, although it has been described that each sub word line driver drives one word line, a plurality of word lines, e.g., four word lines or eight word lines may be driven.

Figure 3:
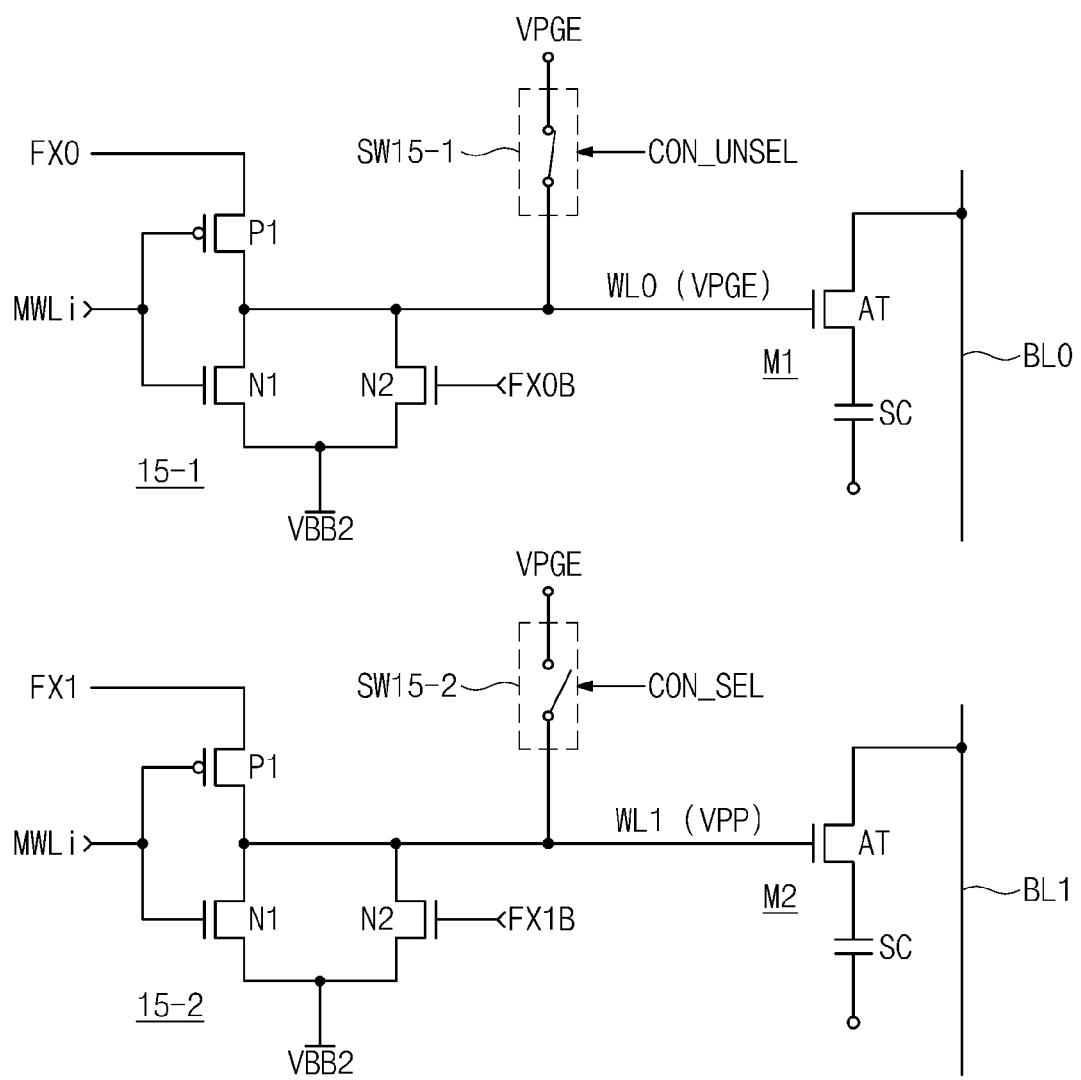
FIG. 3 is a diagram illustrating an exemplary connection configuration between a sub word line driver and a memory cell of FIG. 2 according to one embodiment.

FIG. 3 is a diagram illustrating an exemplary connection configuration between a sub word line driver and a memory cell of FIG. 2 according to one embodiment.

Referring to FIG. 3, an exemplary configuration of the sub word line drivers 15-1 and 15-2 including PMOS transistors and NMOS transistors is shown.

The sub word line driver 15-1 may include a PMOS transistor P1, NMOS transistors N1 and N2, and a driving switch SW15-1.

The sub word line driver 15-1 may drive the word line WL0 at the first voltage, i.e., VBB2 level in response to a main word line driving signal MWLi applied at a low level and a word line driving control signal FX0 applied at a low level. In the access operation mode, when the driving switch SW15-1 of the sub word line driver 15-1 is switched on by a nonselection control signal CON UNSEL, the word line WL0 may increase to the second voltage, i.e., the voltage level of VPGE.

Meanwhile, the sub word line driver 15-2 may drive the word line WL1 to be accessed at a high voltage level, i.e., VPP level in response to the main word line driving signal MWLi applied at a low level and a word line driving control signal FX1 applied to a high level (i.e., a VPP level). In the access operation mode, the driving switch SW15-2 of the sub word line driver 15-2 may be switched off by a selection control signal CON SEL. Accordingly, the word line WL1 may not be provided with the VPGE voltage.

Accordingly, when the temperature sensor circuit 110 indicates the low temperature region, the voltage level of the adjacent word line WL0 may increase to the VPGE level. Thus, the threshold voltage Vth of the access transistor AT connected to the selected word line WL1 may be lowered due to the passing gate effect, thereby improving the tRDL characteristics.

In FIG. 3, the NMOS transistor N2 inside each sub word line driver may be removed.

A memory cell M2 may be one of memory cells connected to the selected word line WL1, and a memory cell M1 may be one of memory cells connected to the unselected word line WL0. Also, the unselected word line WL0 may be a word line adjacent to the selected word line WL1.

One memory cell M2 may include an access transistor AT and a storage capacitor SC. In the write operation mode, write data may be applied to the drain of the access transistor AT via the bit line BL1. When the selected word line WL1 is activated into a high voltage level, the access transistor AT may be turned on to write data in the storage capacitor SC.

Figure 4:
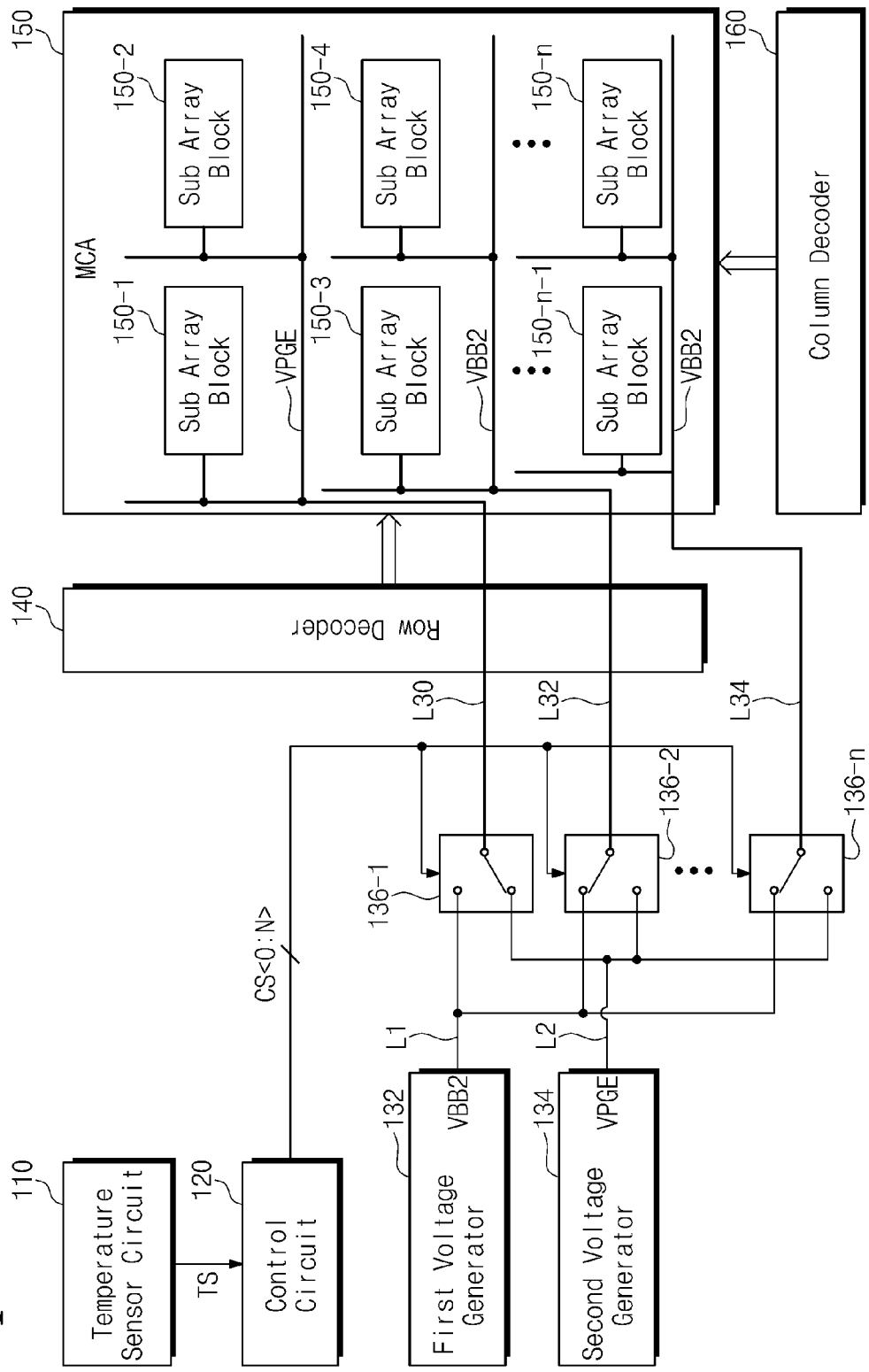
FIG. 4 is an exemplary block diagram illustrating a semiconductor memory device according to another embodiment.

FIG. 4 is an exemplary block diagram illustrating a semiconductor memory device according to another embodiment.

Referring to FIG. 4, unlike the driving of a full chip unit (e.g., memory cell array 150) of FIG. 1, a circuit configuration of driving by a sub array block of the memory cell array 150 is shown.

In FIG. 4, a selection switching circuit 136 may include a plurality of sub switching circuits 136-1, 136-2, . . . , 136-n.

The sub switching circuit 136-1 may switch on one of the first voltage VBB2 and the second voltage VPGE in response to the control signal CS of the control circuit 120.

In response to the access command, when the temperature sensing signal TS outputted from the temperature sensor circuit 110 indicates a low temperature region, the control circuit 120 may activate the control signal CS individually or collectively driving the sub array blocks. For example, the control signal CS may be generated as control data CS<0:N> of at least two bits.

For example, assuming one of the word lines of the sub array block 150-1 is selected, the control data CS<0:N> may be generated as a signal that switches on only the sub switching circuit 136-1 but switches off other sub switching circuits.

Accordingly, a supply line L30 may supply the second voltage VPGE to the sub array blocks 150-1 and 150-2. On the other hand, a supply line L32 may supply the first voltage VBB2 to the sub array blocks 150-3 and 150-4. Also, a supply line L34 may supply the first voltage VBB2 to the sub array blocks 150-n−1 and 150-n.

Thus, when the second voltage VPGE is applied to unselected word lines adjacent to the selected word line in the sub array block 150-1, i.e., by unit of sub array block, power consumption can be reduced compared to application of the full chip unit.

Figure 5:
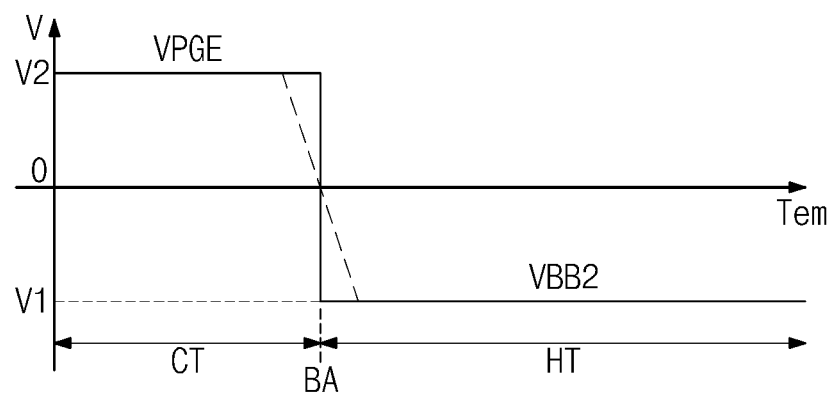
FIG. 5 is an exemplary diagram illustrating a setting temperature range in which the driving operation of FIGS. 1 and 4 are applied according to one embodiment.

FIG. 5 is an exemplary diagram illustrating a setting temperature range in which the driving operation of FIGS. 1 and 4 are applied according to one embodiment.

Referring to FIG. 5, the horizontal axis denotes operating temperature of a semiconductor memory device, and the vertical axis denotes voltage. CT denotes a cold temperature range based on an operation application boundary region BA. Meanwhile, HT denotes a hot temperature range based on the operation application boundary region BA. The control circuit 120 of FIG. 1 may generate a control signal CS that allows the second voltage VPGE to be supplied upon reception of the access command when the temperature sensing signal CS indicates a low temperature region. On the other hand, the control circuit 120 may generate a control signal CS that allows the first voltage VBB2 to be supplied when the temperature sensing signal CS indicates a high temperature region.

Thus, the second voltage VPGE that causes the passing gate effect may be supplied to word lines adjacent to a word line to be accessed in a section CT.

Figure 6:
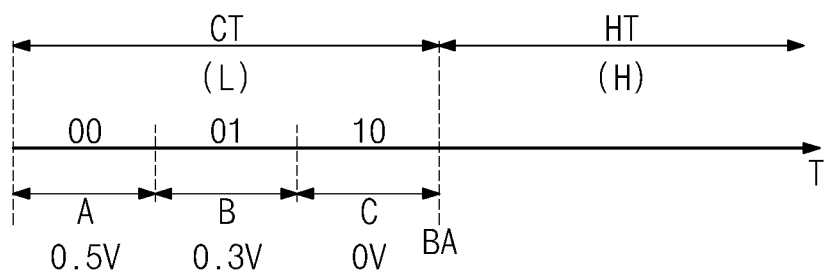
FIG. 6 is an exemplary diagram illustrating the setting temperature range of FIG. 5 divided into a plurality of regions according to one embodiment.

FIG. 6 is an exemplary diagram illustrating the setting temperature range of FIG. 5 divided into a plurality of regions according to one embodiment.

Referring to FIG. 6, the cold temperature section CT of FIG. 5 may be divided into a plurality of regions. For example, the cold temperature section CT may be divided into three regions A, B and C. In the region A, the second voltage VPGE may be applied at about 0.5 V. In the region B, the second voltage VPGE may be applied at about 0.3 V. Also, in the region C, the second voltage VPGE may be applied at about 0 V.

When the second voltage VPGE is applied at about 0.5 V, the temperature sensing signal CS of the temperature sensor circuit 110 may be outputted as "00". On the other hand, when the second voltage VPGE is applied at about 0 V, the temperature sensing signal CS of the temperature sensor circuit 110 may be outputted as "10".

Thus, when the cold temperature range is divided into a plurality of regions, the voltage level that causes the passing gate effect may be discriminatively set according to the temperature of the semiconductor memory device.

Figure 7:
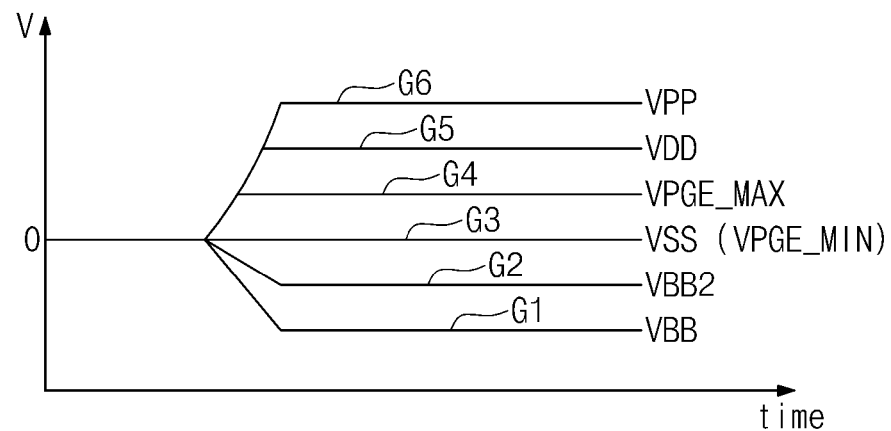
FIG. 7 is a diagram illustrating exemplary levels of voltages used in FIGS. 1 and 4 according to one embodiment.

FIG. 7 is a diagram illustrating exemplary levels of voltages used in FIGS. 1 and 4 according to one embodiment.

In FIG. 7, the horizontal axis indicates time, and the vertical axis indicates voltage.

A graph G1 represents a VBB voltage level, and a graph G2 represents a VBB2 voltage level. Also, a graph G3 represents a ground voltage, VSS voltage level, and a graph G4 represents a maximum passing gate voltage VPGE MAX. For example, the level of the second voltage may be between the VSS level and the voltage level of the graph G4.

On the other hand, a graph G5 represents a VDD voltage level, and a graph G6 represents a high voltage VPP voltage level. The voltage of the graph G6 becomes a voltage level applied to a selected word line.

Figure 8:
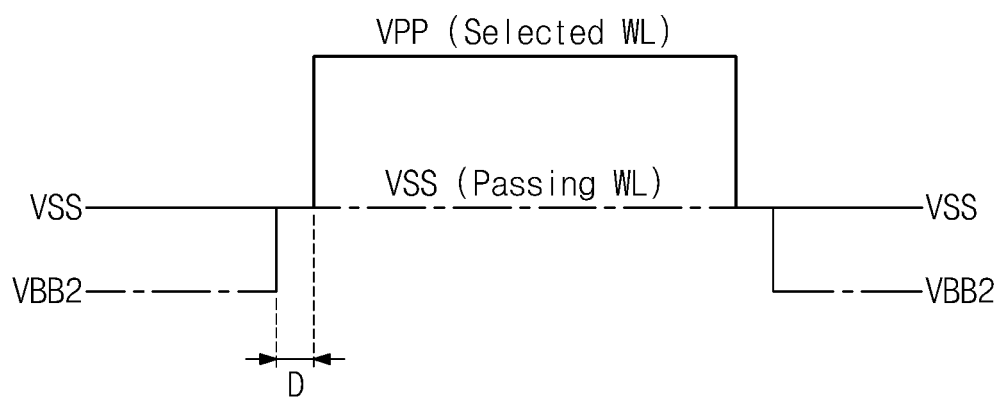
FIG. 8 is a block diagram illustrating an exemplary voltage driving according to one embodiment.

FIG. 8 is a block diagram illustrating an exemplary voltage driving according to one embodiment.

Referring to FIG. 8, it can be seen that the voltage level of word lines adjacent to a word line to be accessed, i.e., the voltage level causing the passing gate effect is applied at the level of the ground voltage VSS. The voltage level of VPGE becomes the VSS level.

In one embodiment, the voltage level of the adjacent word lines may be precharged into the voltage level of VBB2 at the initial stage, and then may increase to the VSS level during the access operation mode.

Meanwhile, VPP may be applied to the selected word line, i.e., the word line to be accessed. The VPP voltage may be applied to the selected word line for a period of time while the semiconductor memory device is in the access operation mode. In one embodiment, a voltage of the selected word line may change from VSS to VPP. In another embodiment, a voltage of the selected word line may change from VBB2 to VPP.

The time point when the voltage level of the adjacent word lines increases to the VSS level may be earlier by a section D than the time point when the VPP voltage is supplied to the selected word line. However, this is merely an example, and the rising time point of the VSS level may be the same as the supply time point of the VPP voltage.

Figure 9:
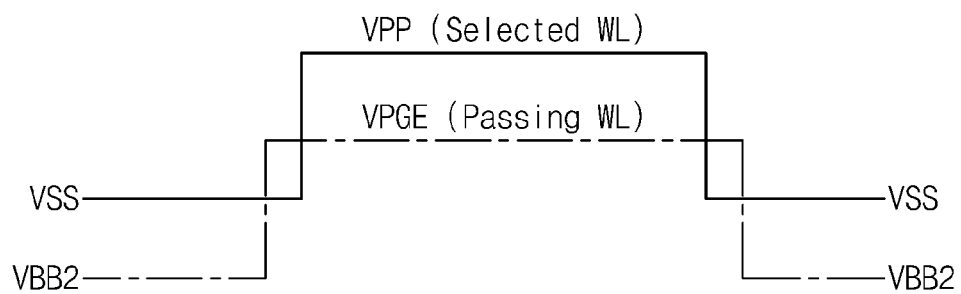
FIG. 9 is a block diagram illustrating another exemplary voltage driving according to one embodiment.

FIG. 9 is a block diagram illustrating another exemplary voltage driving according to one embodiment.

Referring to FIG. 9, it can be seen that the voltage level of word lines adjacent to a word line to be accessed, i.e., the voltage level causing the passing gate effect is applied at the VPGE level higher than the level of the ground voltage VSS. For example, the voltage level of VPGE may be determined within a range from the VSS level to the level of the graph G4 of FIG. 7.

In one embodiment, the voltage level of the adjacent word lines may be precharged into the voltage level of VBB2 at the initial stage, and then may increase to the VPGE level during the access operation mode.

Meanwhile, VPP may be applied to the selected word line, i.e., the word line to be accessed. In one embodiment, a voltage of the selected word line may change from VSS to VPP. In another embodiment, a voltage of the selected word line may change from VBB2 to VPP.

Similarly, the time point when the voltage level of the adjacent word lines increases to the VPGE level may be earlier than or the same as the time point when the VPP voltage is supplied to the selected word line.

Figure 10:
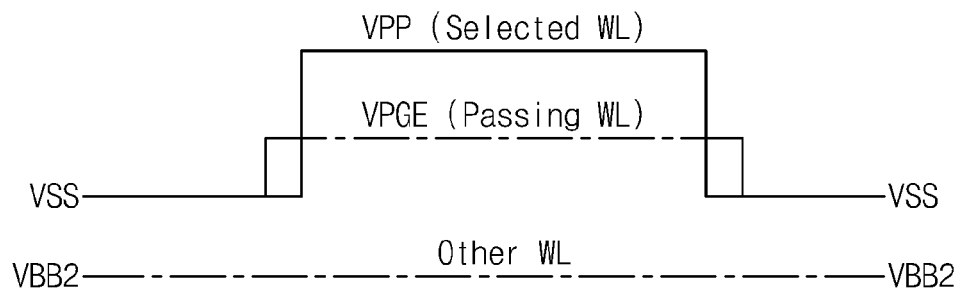
FIG. 10 is a block diagram illustrating still another exemplary voltage driving according to one embodiment.

FIG. 10 is a block diagram illustrating still another exemplary voltage driving according to one embodiment.

Referring to FIG. 10, it can be seen that the voltage level of word lines adjacent to a word line to be accessed is applied at the VPGE level higher than the level of the ground voltage VSS. For example, the voltage level of VPGE may be determined within a range from the VSS level to the level of the graph G4 of FIG. 7.

In one embodiment, the voltage level of the adjacent word lines may be precharged into the voltage level of VSS at the initial stage, and then may increase to the VPGE level during the access operation mode.

Meanwhile, VPP may be applied to the selected word line, i.e., the word line to be accessed. In one embodiment, a voltage of the selected word line may change from VSS to VPP. In another embodiment, a voltage of the selected word line may change from VBB2 to VPP.

Also, other word lines except the word line to be accessed and the word lines adjacent thereto may be maintained at the first voltage, i.e., VBB2 level regardless of the access operation mode.

Figure 11:
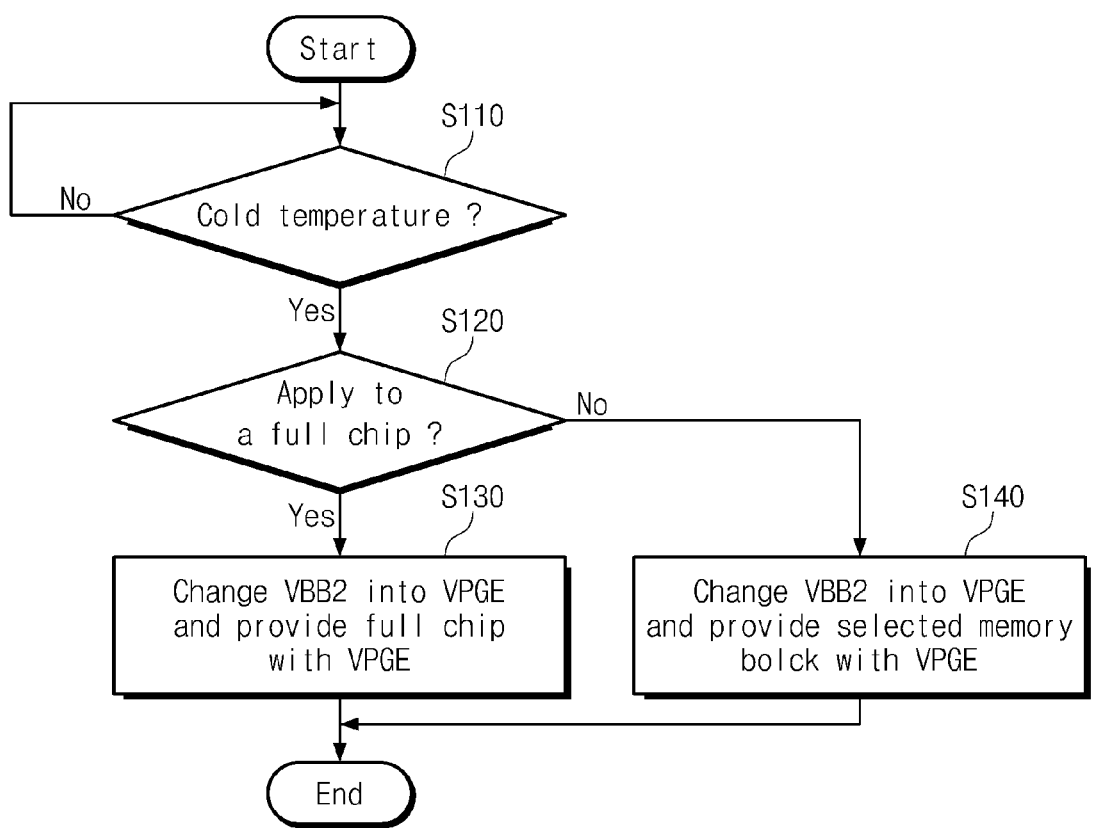
FIG. 11 is an exemplary flowchart illustrating a control of voltage driving according to certain embodiments.

FIG. 11 is an exemplary flowchart illustrating a control of voltage driving according to certain embodiments.

Referring to FIG. 11, in operation S110, the control circuit 120 may determine whether or not the memory cell array 150 falls within the cold temperature range during the access operation mode.

When it is determined in operation S110 that the memory cell array 150 falls within the cold temperature range, in operation S120, it may be checked whether the voltage driving is performed by full chip unit (e.g., a memory cell array 150) or by memory block unit (e.g., sub array block). In one embodiment, the determination of the full chip unit or memory block unit may be performed by a user through a mode register set MRS.

In case of full chip unit, the control circuit 120 may perform operation S130. Meanwhile, in case where the memory block unit, i.e., sub array block unit is applied, the control circuit 120 may perform operation S140.

In operation S130, the control circuit 120 may allow the VPGE voltage level to be supplied to the word lines adjacent to the word line to be accessed, which is precharged at the level of VBB2. The VPGE voltage level may be supplied to all sub array blocks inside the chip.

In operation S140, the control circuit 120 may allow the VPGE voltage level to be supplied to the word lines adjacent to the word line to be accessed, which is precharged at the level of VBB2. The VPGE voltage level may be supplied only to the selected sub array block. For example, the first voltage VBB2 may be still provided to blocks except the selected sub array blocks at the precharged level.

As described above, the DRAM operating method according to disclosed embodiments may include receiving an access command and setting the voltage level of the word lines adjacent to the word line to be accessed as a voltage level that causes the passing gate effect. Also, an activation voltage for the access operation may be applied to the word line to be accessed.

Accordingly, when the precharge level of the word lines adjacent to the word line to be accessed increases, the threshold voltage of the memory cell of the word line to be accessed may be reduced due to the occurrence of the passing gate effect. Thus, the on current of the memory cell connected to the selected word line may increase, improving tRDL at a low temperature region.

Figure 12:
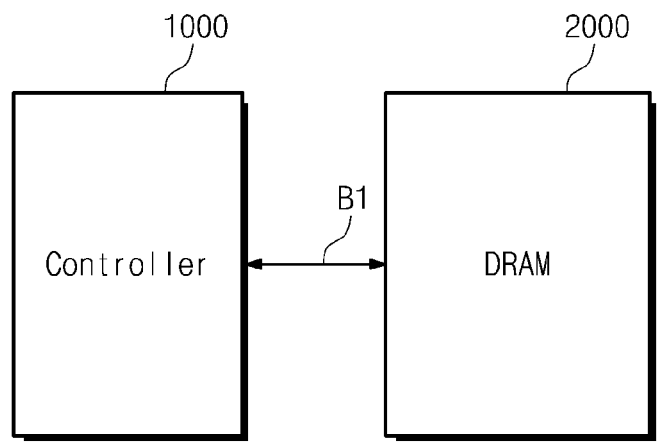
FIG. 12 is a block diagram illustrating an application applied to a memory system according to certain embodiments.

FIG. 12 is a block diagram illustrating a memory system according to certain embodiments.

Referring to FIG. 12, the memory system may include a controller 1000 and a Dynamic Random Access Memory (DRAM) 2000. The controller 1000 may be connected to the DRAM 2000 via a bus B1.

The controller 1000 may be connected to a host (not shown) through a predetermined interface.

The DRAM 2000 may have the same configuration as FIG. 1 or 4.

Accordingly, in the memory system, the DRAM 2000 may improve the write operation characteristics of the semiconductor memory device due to the occurrence of the passing gate effect at a relatively low temperature. Thus, the write operation performance of the memory system can be improved.

Figure 13:
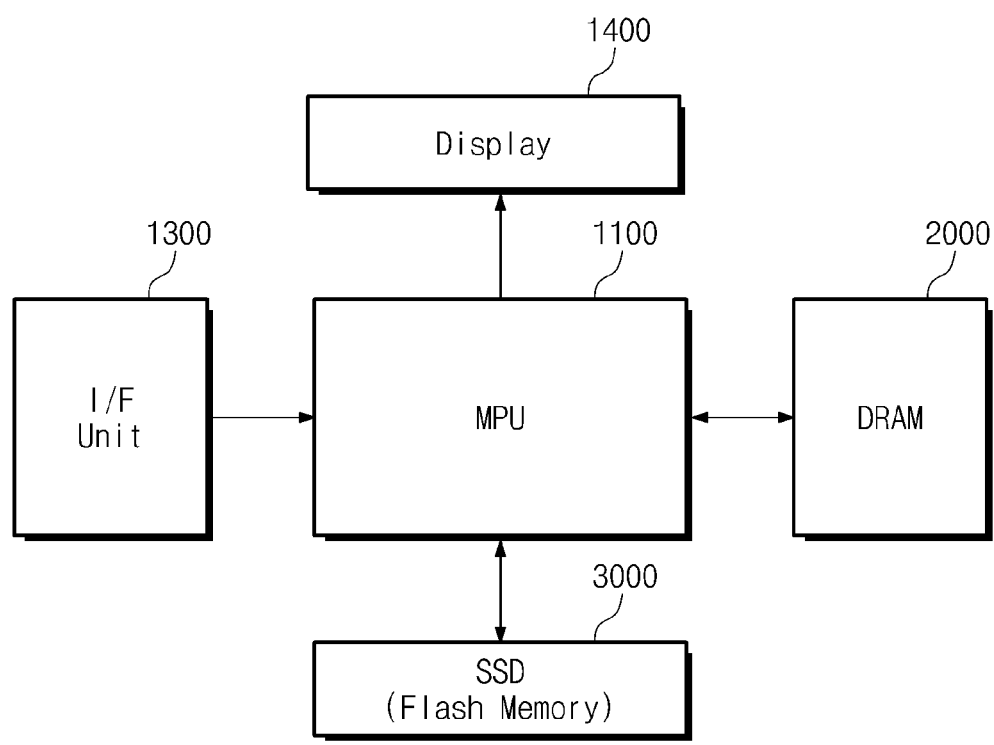
FIG. 13 is a block diagram illustrating an application applied to a mobile device according to certain embodiments.

FIG. 13 is a block diagram illustrating a mobile device according to certain embodiments.

Referring to FIG. 13, a mobile device, e.g., notebook or portable electronics may include, for example, a Micro Processing Unit (MPU) 1100, a display 1400, an interface unit 1300, a DRAM 2000, and a Solid State Drive (SSD) 3000.

The MPU 1100, the DRAM 2000, and the SSD 3000 may be manufactured into one chip, or may be packaged. The DRAM 2000 may have the same configuration as FIG. 1 or 4. In one embodiment, the SSD 3000 includes a flash memory. For example, the DRAM 2000 and the flash memory 3000 may be embedded in the mobile device.

When the mobile device is a portable communication device, the interface unit 1300 may be connected to a modem or a transceiver which performs communication data transmission/reception and data modulation/demodulation.

The MPU 1100 may control the overall operations of the mobile device according to predetermined programs.

The DRAM 2000 may be connected to the MPU 1100 via a system bus, and may serve as a buffer memory or a main memory of the MPU 1100. As described in one embodiment, the DRAM 2000 may improve the write operation characteristics during the access operation mode using the passing gate effect at a low temperature region.

The SSD 3000 may be implemented, for example, with a NOR or NAND type of flash memory.

The display 1400 may be, for example, a liquid crystal or organic light emitting diode device having a backlight, and may have a touchscreen. The display 1400 may function as an output device that displays color images such as characters, figures, and pictures.

Although the mobile device is exemplified as a mobile communication device, the mobile device can function as a smart card by adding or subtracting components if necessary.

The mobile device may be connected to an external communication device through a separate interface. The communication device may include a Digital Versatile Disc (DVD) player, a computer, a set top box (STB), a game console, and a digital camcorder.

Although not shown in the drawing, it will be apparent to those skilled in the art that the mobile device can be further provided with an application chipset, a Camera Image Processor (CIS), and a mobile DRAM.

Although the flash memory is exemplified in FIG. 13, various kinds of nonvolatile storage can be used.

The nonvolatile storage can store various forms of data such as text, graphics, and software codes.

The nonvolatile storage may be implemented with Electrically Erasable Programmable Read-Only Memory (EEPROM), flash memory, Magnetic RAM (MRAM), spin-transfer torque MRAM, Conductive Bridging RAM (CBRAM), Ferroelectric RAM (FeRAM), Phase change RAM (PRAM) also referred to as Ovonic Unified Memory (OUM), Resistive RAM (RRAM or ReRAM), nanotube RRAM, Polymer RAM (PoRAM), Nano Floating Gate Memory (NFGM), holographic memory, molecular electronics memory device, or insulator resistance change memory.

Figure 14:
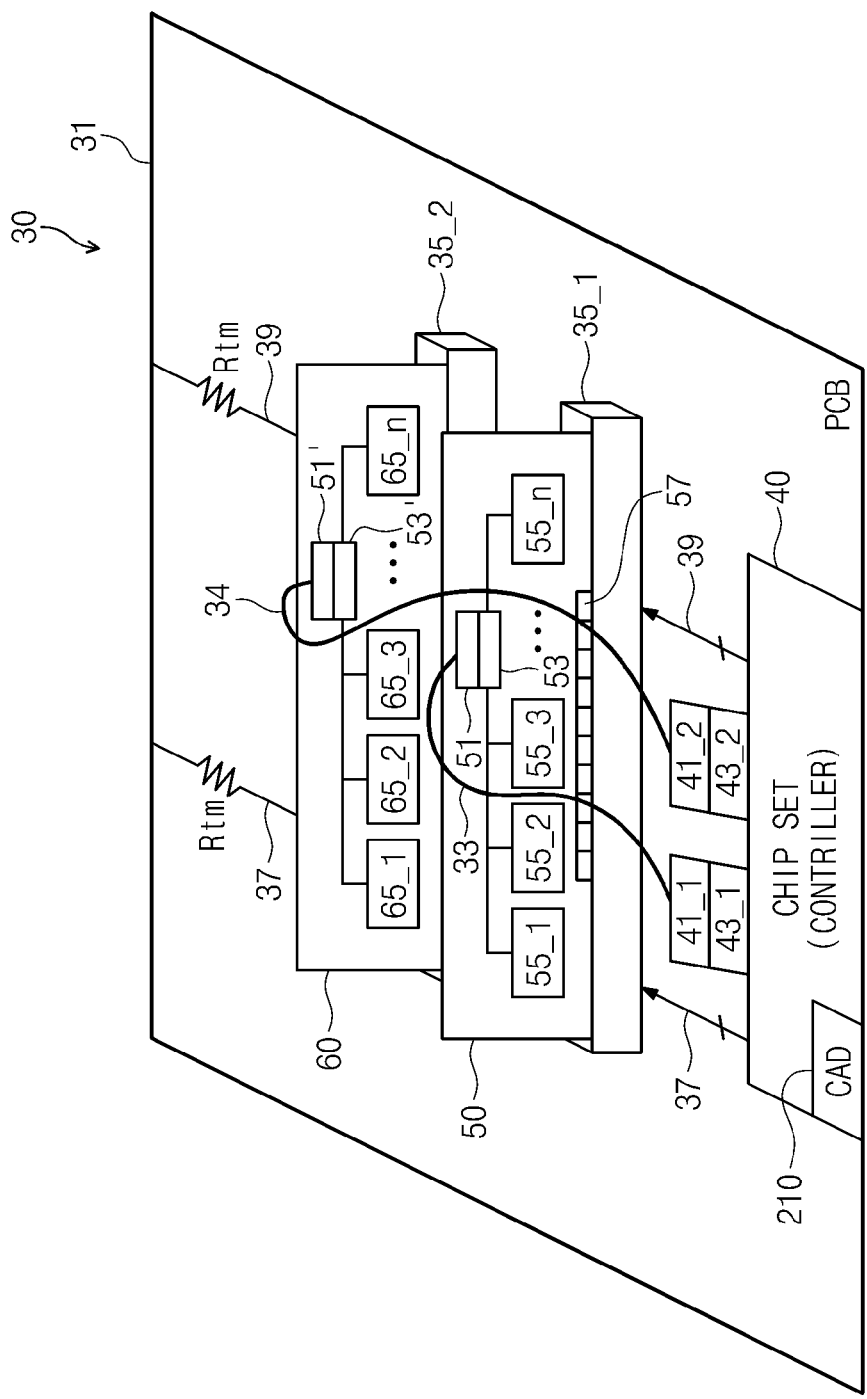
FIG. 14 is a block diagram illustrating an application applied to an optical I/O schema according to certain embodiments.

FIG. 14 is a block diagram illustrating an optical I/O schema according to certain embodiments.

Referring to FIG. 14, a memory system 30 adopting a high speed optic I/O may include a chipset 40 as a controller, and memory modules 50 and 60, which are mounted on a PCB substrate 31. The memory modules 50 and 60 may be inserted into slots 35_1 and 35_2 disposed on the PCB substrate 31, respectively. The memory module 50 may include a connector 57, DRAM memory chips 55_1 to 55_n, an optical I/O input unit 51, and an optical I/O output unit 53. The memory module 60 may include DRAM memory chips 65_1 to 65_n, an optical I/O input unit 51', and an optical I/O output unit 53'.

The optical I/O input unit 51 may include a photoelectric conversion element, e.g., photodiode to convert an applied optical signal into an electric signal. The memory module 50 may receive an electrical signal outputted from the photoelectric conversion element. The optical I/O output unit 53 may include a photoelectric conversion element, e.g., laser diode to convert an electric signal outputted from the memory module 50 into an optical signal. If necessary, the optical I/O output unit 53 may further include an optical modulator to modulate a signal outputted from a light source.

An optical cable 33 may take charge of optical communication between the optical I/O input unit 51 of the memory module 50 and an optical transmission unit 41_1 of the chipset 40. The optical communication may have a bandwidth of several tens of gigabits per second. The memory module 50 may receive signals or data applied from signal lines 37 and 39 of the chipset 40 through the connector 57, and may perform high speed data communication with the chipset 40 through the optical cable 33. Meanwhile, resistors Rtm installed on unexplained lines 37 and 39 may be termination resistors.

Even in case of the memory system 30 adopting the optical I/O structure like in FIG. 14, DRAM memory chips 55_1 to 55_n according to disclosed embodiments may be provided.

Accordingly, in the memory system 30, the DRAM memory modules 55_1 to 55_n may be enhanced in write operation characteristics.

In FIG. 14, the chipset 40 may include an intensive access detector 210. The intensive access detector 210 may generate an intensive access detection signal when the number of addresses being frequently applied exceeds a predetermined threshold value.

When the intensive access detection signal is generated, the chipset 40 may prevent or alleviate corruption of data stored in the memory cells of memory regions adjacent to a specific memory region.

For example, when a specific word line, a specific bit line, or a specific memory block of a volatile semiconductor memory such as DRAM is intensively accessed, the corruption of memory cell data may incur. That is, cell data stored in memory cells of word lines adjacent to a specific word line, bit lines adjacent to a specific bit line, or memory blocks adjacent to a specific memory block may be lost due to intensive access. Accordingly, it is necessary to prevent or alleviate the loss of cell data by reducing or avoiding the intensive address access.

When the DRAM memory chips 55_1 to 55_n and 65_1 to 65_n of the memory modules 50 and 60 are accessed by unit of memory page, column, or bank, the intensive access detector 210 can monitor intensive access.

In the memory system of FIG. 14, the DRAM memory chips 55_1 to 55_n may be used as a user data buffer.

Figure 15:
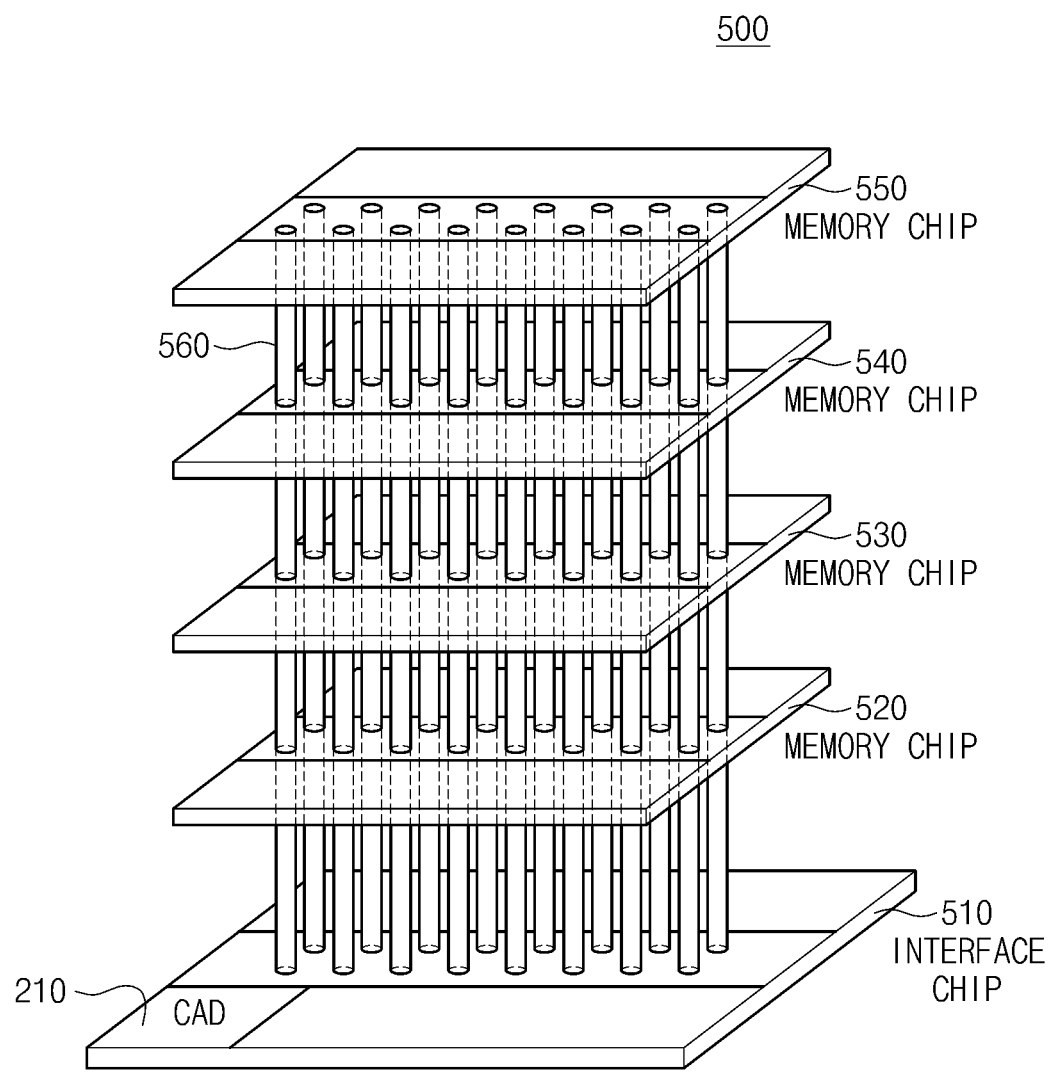
FIG. 15 is a block diagram illustrating an application applied to a through silicon via according to certain embodiments.

FIG. 15 is a block diagram illustrating a system including Through Substrate Vias (e.g., Through Silicon Vias (TSVs)) according to certain embodiments.

Referring to FIG. 15, a stack-type memory device 500 may include an interface chip 510 and a plurality of memory chips 520, 530, 540 and 550 that are sequentially stacked on the interface chip 510. Here, a plurality of through silicon vias 560 may be formed to penetrate the memory chips 520, 530, 540 and 550. The three dimensional stack package type memory device 500 in which the plurality of memory chips are vertically stacked on the interface chip 510 using the TSV technology may store a large capacity of data, and may be advantageous for high speed, low power consumption, and miniaturization.

Even in case of the stack-type memory device of FIG. 15, since the interface chip 510 includes an intensive access detector 210, corruption of data stored in DRAMs of the plurality of memory chips 520, 530, 540 and 550 can be efficiently prevented or alleviated.

In the stack-type memory device as shown in FIG. 15, DRAMs according to disclosed embodiments, i.e., memories with improved write operation characteristics due to the passing gate effect can be mounted. Accordingly, DRAMs constituting the plurality of memory chips 520, 530, 540 and 550 may have tRDL characteristics relatively enhanced at a low temperature region.

Figure 16:
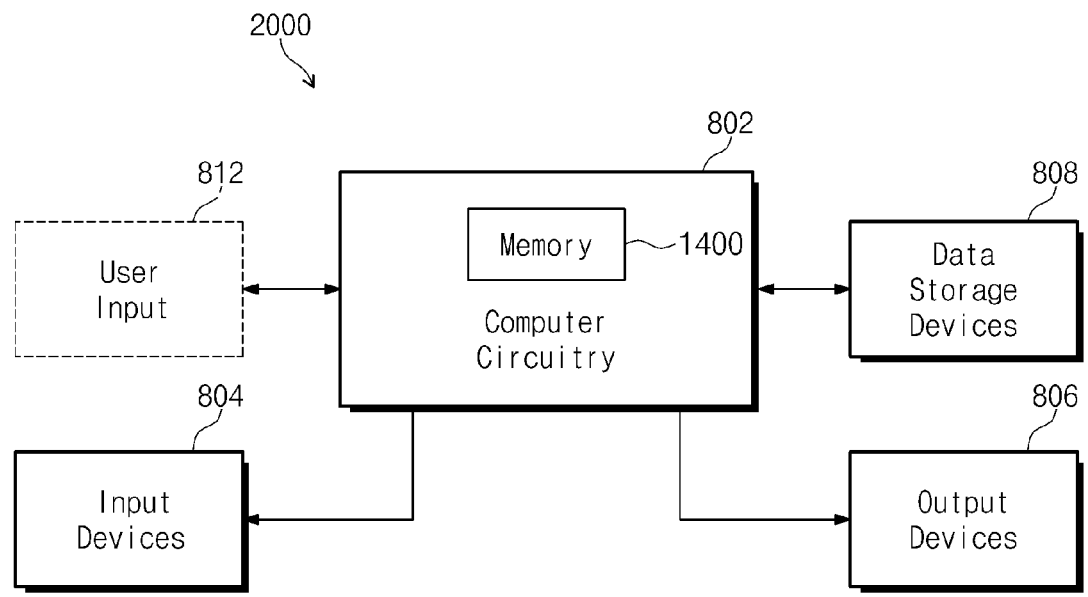
FIG. 16 is a block diagram illustrating an application applied to a data processing unit according to certain embodiments.

FIG. 16 is a block diagram illustrating a data processing unit according to certain embodiments.

Referring to FIG. 16, a data processing unit 2000 may include a computer circuitry 802 including a memory 1400, input devices 804, output devices 806, and data storage devices 808. Also, for convenience of user, the data processing unit 2000 may further include a user input 812. The user input 812 may be an input element including, for example, number keys and function keys, and may serve to interface between electronic system and users.

In such case, since the memory 1400 of the data processing unit 2000 includes DRAMs according to disclosed embodiments, the write operation performance of the data processing unit 2000 can be improved.

Figure 17:
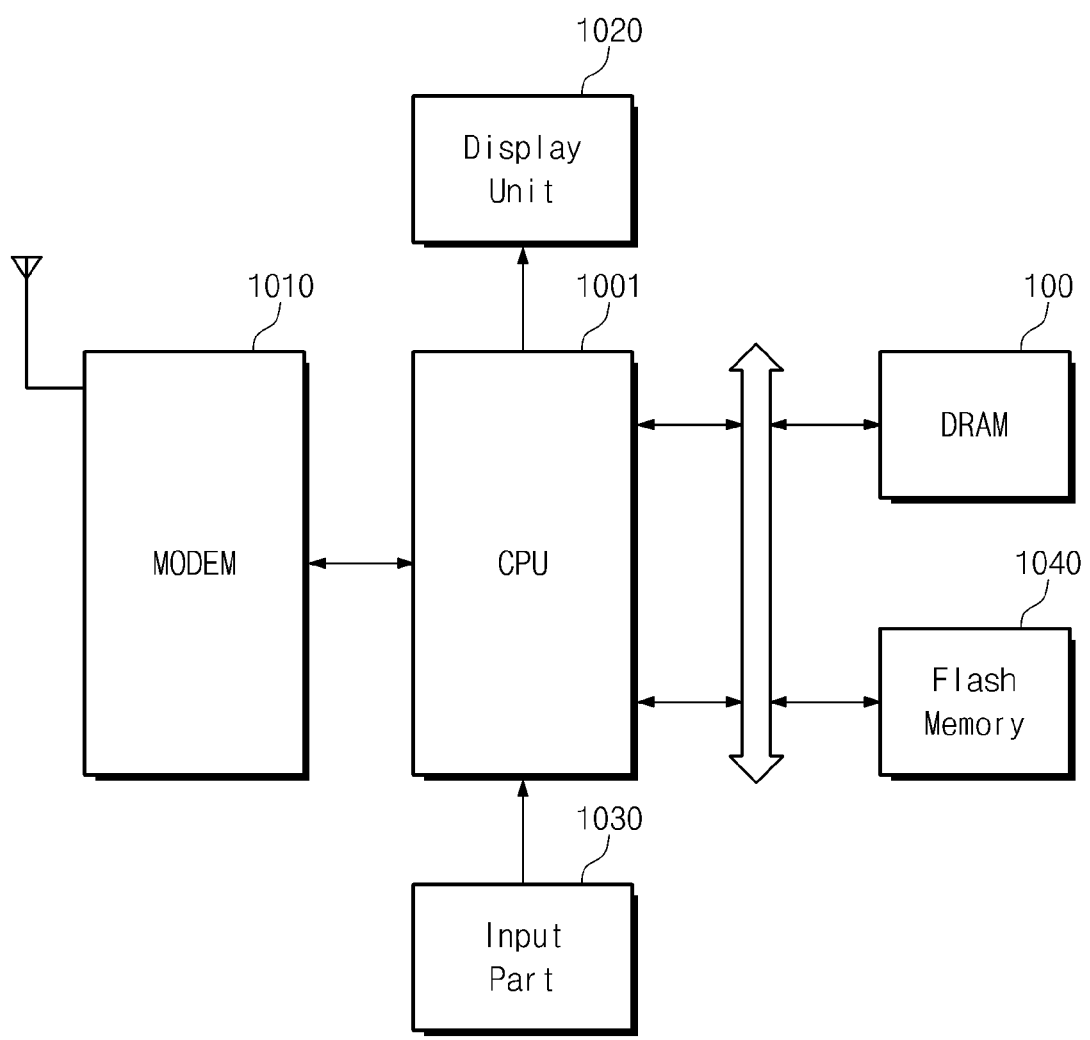
FIG. 17 is a block diagram illustrating an application applied to a mobile device according to certain embodiments.

FIG. 17 is a block diagram illustrating a mobile device according to certain embodiments.

Referring to FIG. 17, a mobile device may include a modem 1010, a CPU 1001, a DRAM 100, a flash memory 1040, a display unit 1020, and an input part 1030.

The DRAM 100 may include a circuit configuration as shown in FIG. 1 or 4.

If necessary, the CPU 1001, the DRAM 100, and the flash memory 1040 may be manufactured into one chip, or may be packaged.

The modem 1010 may perform modulation/demodulation functions of communication data.

The CPU 1001 may control overall operations of the mobile device according to predetermined programs.

The DRAM 100 may serve as a main memory of the CPU 1001, and may be a synchronous DRAM.

The flash memory 1040 may be a NOR or NAND type of flash memory.

The display unit 1020 may be a liquid crystal or organic light emitting diode device having a backlight, and may have a touchscreen. The display unit 1020 may function as an output device that displays color images such as characters, figures, and pictures.

The input part 1030 may be an input element including number keys and function keys, and may serve to interface between the electronic devices and users.

Since the DRAM 100 includes configuration as shown in FIG. 1 or 4, the write operation performance can be improved.

Although the mobile device is a mobile communication device, the mobile device can function as a smart card or a Solid State Drive (SSD) by adding or subtracting components if necessary.

The mobile device may be connected to an external communication device through a separate interface. The communication device may include a Digital Versatile Disc (DVD) player, a computer, a set top box (STB), a game console, and a digital camcorder.

Although not shown in the drawing, it will be apparent to those skilled in the art that the mobile device can be further provided with an application chipset, a Camera Image Processor (CIS), and a mobile DRAM.

Chips forming the mobile device may be mounted in various types of packages. For example, the chips can be packaged as packages such as Package on Package (PoP), Ball Grid Arrays (BGA), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Although the flash memory is exemplified in FIG. 17, a nonvolatile storage can be used.

The nonvolatile storage can store various forms of data such as text, graphics, and software codes According to exemplary embodiments of the inventive concept, the write operation characteristics of a semiconductor memory device can be improved by inducing the passing gate effect at a relatively low temperature region.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description. For example, in other cases, the circuitry of FIGS. 1 and 4 can be modified, or the voltage driving method can be modified without deviating from the technical sprite of the inventive concept.

Also, DRAMs including DRAM memory cells have been exemplified in the embodiments of the disclosure, but without being limited thereto, the inventive concept can be applied to other semiconductor devices that require the passing gate effect.

What is claimed is:

1. A method of operating a semiconductor memory device, the method comprising:
   receiving an access command;
   applying a first voltage to a selected word line of the semiconductor memory device for a period of time in response to receiving the access command;
   applying a second voltage to unselected word lines adjacent to the selected word line before and after the period of time;
   in response to the semiconductor memory device being at a temperature below a predetermined temperature, applying a third voltage to the unselected word lines adjacent to the selected word line for the period of time, a voltage level of the third voltage greater than the second voltage; and
   in response to the semiconductor memory device being at a temperature above the predetermined temperature, applying the second voltage to the unselected word lines adjacent to the selected word line for the period of time.

2. The method of claim 1, wherein a level of the second voltage is a negative voltage lower than a ground voltage.

3. The method of claim 2, wherein a level of the third voltage is equal to or higher than the ground voltage.

4. The method of claim 2, further comprising applying the second voltage to a first set of unselected word lines different from the unselected word lines adjacent to the selected word line for the period of time.

5. The method of claim 1, wherein a level of the third voltage is determined based on an operating temperature of the semiconductor memory device.

6. The method of claim 1, wherein a write operation of the semiconductor memory device occurs in response to receiving the access command.

7. The method of claim 1, wherein a threshold voltage of an access transistor of a memory cell connected to the selected word line is lowered when the third voltage is applied to the unselected word lines adjacent to the selected word line.

8. A semiconductor memory device comprising:
   a memory cell array including a plurality of memory cells connected to word lines;
   a voltage generator configured to generate a first voltage and a second voltage having a level higher than the first voltage, a level of the first voltage being a negative voltage lower than a ground voltage; and
   a control circuit configured to control applying the first voltage to word lines adjacent to a selected word line of the memory cell array before and after a period of time, and applying the second voltage to the word lines adjacent to the selected word line for the period of time,
   wherein applying the second voltage occurs in response to receiving an access command.

9. The semiconductor memory device of claim 8, further comprising a temperature sensor configured to detect an operating temperature of the semiconductor memory device,
   wherein the control circuit is configured to control applying the second voltage to the word lines adjacent to the selected word line when the detected operating temperature is lower than a predetermined temperature.

10. The semiconductor memory device of claim 9, wherein a level of the second voltage is equal to or higher than the ground voltage.

11. The semiconductor memory device of claim 9, wherein a level of the second voltage is determined based on an operating temperature of the semiconductor memory device.

12. The semiconductor memory device of claim 8, wherein the selected word line is included in a first sub array of the memory cell array, and
wherein the control circuit is further configured to, for the period of time, control applying the second voltage to unselected word lines of the first sub array and control applying the first voltage to unselected word lines of other sub arrays of the memory cell array.

13. The semiconductor memory device of claim 8, wherein the semiconductor memory device is configured to write data to a memory cell connected to the selected word line in response to receiving the access command.

14. A method of operating a semiconductor memory device including a memory cell array, the method comprising:
applying a first voltage to a selected word line of the memory cell array for a period of time in response to receiving an access command;
applying a second voltage to one or more word lines adjacent to the selected word line, a level of the second voltage less than the first voltage; and
for the period of time, switching the second voltage to a third voltage and applying the third voltage to the one or more word lines adjacent to the selected word line, a level of the third voltage greater than the second voltage and less than the first voltage,
wherein switching the second voltage to the third voltage occurs when the semiconductor memory device is operated at a temperature below a predetermined temperature.

15. The method of claim 14, further comprising applying the second voltage to a first set of unselected word lines of the memory cell array different from the one or more word lines adjacent to the selected word line for the period of time.

16. The method of claim 14, wherein a level of the first voltage is greater than a power supply voltage and a level of the second voltage is a negative voltage.

17. The method of claim 16, wherein a level of the third voltage is equal to or higher than the ground voltage.

18. The method of claim 14, wherein the selected word line is included in a first sub array of the memory cell array, and
wherein for the period of time, applying the third voltage to unselected word lines of the first sub array and applying the second voltage to unselected word lines of other sub arrays of the memory cell array.

19. The method of claim 14, wherein a write operation of the semiconductor memory device occurs in response to receiving the access command.

20. The method of claim 14, wherein a level of the third voltage is determined based on an operating temperature of the semiconductor memory device.

* * * * *